(12) United States Patent
Huang et al.

(10) Patent No.: US 7,042,280 B1
(45) Date of Patent: May 9, 2006

(54) OVER-CURRENT PROTECTION CIRCUIT

(75) Inventors: Shengming Huang, Gourock (GB); Robin Shields, Greenock (GB); John Gough, Beith (GB)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/737,254

(22) Filed: Dec. 15, 2003

(51) Int. Cl.
 G05F 1/10 (2006.01)
(52) U.S. Cl. .................... 327/541; 327/546; 323/316
(58) Field of Classification Search ................ 327/540, 327/541, 545, 546; 323/315, 316
 See application file for complete search history.

(56) References Cited

U.S. PATENT DOCUMENTS

| | | | | |
|---|---|---|---|---|
| 4,683,382 A | * | 7/1987 | Sakurai et al. | 327/544 |
| 5,739,712 A | * | 4/1998 | Fujii | 327/323 |
| 5,821,808 A | * | 10/1998 | Fujima | 327/541 |
| 5,831,471 A | * | 11/1998 | Nakajima et al. | 327/540 |
| 5,856,756 A | * | 1/1999 | Sasahara et al. | 327/540 |
| 6,166,530 A | * | 12/2000 | D'Angelo | 323/316 |
| 6,225,857 B1 | * | 5/2001 | Brokaw | 327/540 |
| 6,563,371 B1 | * | 5/2003 | Buckley et al. | 327/539 |
| 6,667,652 B1 | * | 12/2003 | Hosoki | 327/538 |

* cited by examiner

Primary Examiner—Terry D. Cunningham
(74) Attorney, Agent, or Firm—Brett A. Hertzberg; Merchant & Gould P.C.

(57) ABSTRACT

A regulator system includes a power device and a sense device. During a normal operating mode, the power device is arranged to deliver current to a load, while the sense device is arranged to monitor the load current. An over-current mode is activated when the sensed load current exceeds a short-circuit current-limit. During the over-current mode, the power device is switched off such that the energy loss is minimized. Once the short-circuit condition is removed, the regulator system returns to the normal operating mode. The sense device is coupled to the load in such a way that the quiescent current of the regulator system does not rise with increasing load current. The regulator system is further arranged such that the short-circuit current-limit decreases automatically with increased operating temperature. The described regulator system has significantly reduced energy losses while also minimizing risks of thermal induced device failures during the short-circuit condition.

25 Claims, 3 Drawing Sheets

OVER-CURRENT PROTECTION CIRCUIT

FIELD OF THE INVENTION

The present invention relates to voltage regulators such as low drop out (LDO) voltage regulators. More particularly, the present invention relates to a method and apparatus for providing over-current protection in a voltage regulator while minimizing power losses, while also minimizing possible device failure.

BACKGROUND OF THE INVENTION

Many modern analog circuits include power management systems that are arranged to provide protection and performance functions. One protection function is referred to as over-current protection. Over-current protection is typically required when a short-circuit condition occurs in the output of a circuit such as a voltage regulator. The over-current protection function can be accomplished by monitoring the current delivered to a load, and clamping the current when the system detects that it has exceeded some maximum level.

Figure 1:
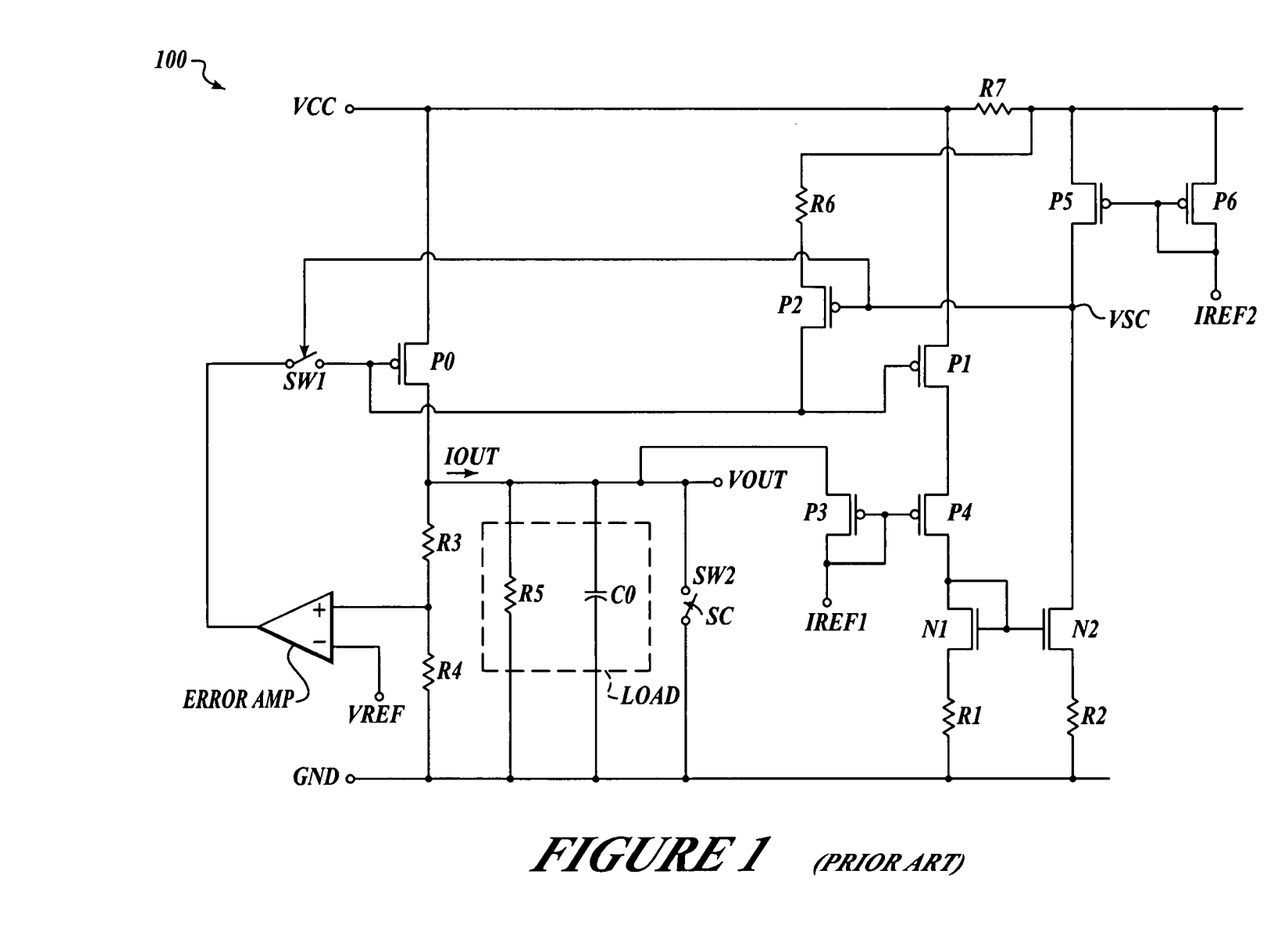
FIG. 1 is an illustration of a conventional voltage regulator that includes over-current protection.

An example voltage regulator with over-current protection circuit (100) is illustrated in FIG. 1. Circuit system 100 includes seven p-type field effect transistors (FETs P0–P6), two n-type field effect transistors (FETs N1–N2), an error amplifier, seven resistors (R1–R7), a capacitor (Co), and two switches (SW1, SW2).

During operation, circuit 100 is operated from a VCC power supply. Reference currents (IREF1, IREF2) are applied to diode connected transistors P3 and P6 respectively. A reference voltage (VREF) is applied to the inverting input of the error amplifier. Resistors R3 and R4 are connected to the output load (R5, Co) to provide a feedback voltage to the non-inverting input of the error amplifier. Transistor P0 delivers an output current (IOUT) to the load (R5, Co), which is replicated by transistor P1. Transistor P3 senses the output voltage to bias transistor P4. Transistors P5 and P6 are arranged to provide a short circuit threshold voltage (VSC) to the gate of transistor P2 and the control terminal of switch SW1. During normal operation, the feedback voltage from resistors R3 and R4 is used to regulate the output voltage (VOUT) across the load (R5, Co) by limiting the output current level (IOUT) via control of the gate voltage of transistor P0.

A short-circuit condition is simulated by the closing of a switch (SW2), which shorts the load (R5, Co) to the circuit ground. Transistor P3 senses the collapsing output voltage from the short-circuit condition and changes the operating current of transistor P4. Transistor N1 senses the current of transistors P1 and P4 and pulls down (via transistor N2) on the short-circuit threshold voltage (VSC) such that transistor P2 is enabled. The regulator output current (IOUT) is clamped to a maximum level at 3 times of its maximum load current normally.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to an apparatus and method for providing over-current protection in a regulator system. The regulator system includes a power device and a sense device. During a normal operating mode, a power device is arranged to deliver current to a load, while the sense device is arranged to monitor the load current. An over-current mode is activated when the sensed load current exceeds a short-circuit current-limit. During the over-current mode, the power device is switched off such that the energy loss is minimized. Once the short-circuit condition is removed, the regulator system returns to the normal operating mode. The sense device is coupled to the load in such a way that the quiescent current of the regulator system does not rise with increasing load current. The regulator system is further arranged such that the short-circuit current-limit decreases automatically with increased operating temperature. The described regulator system has significantly reduced energy losses while also minimizing risks of thermal induced device failures during the short-circuit condition.

Figure 2:
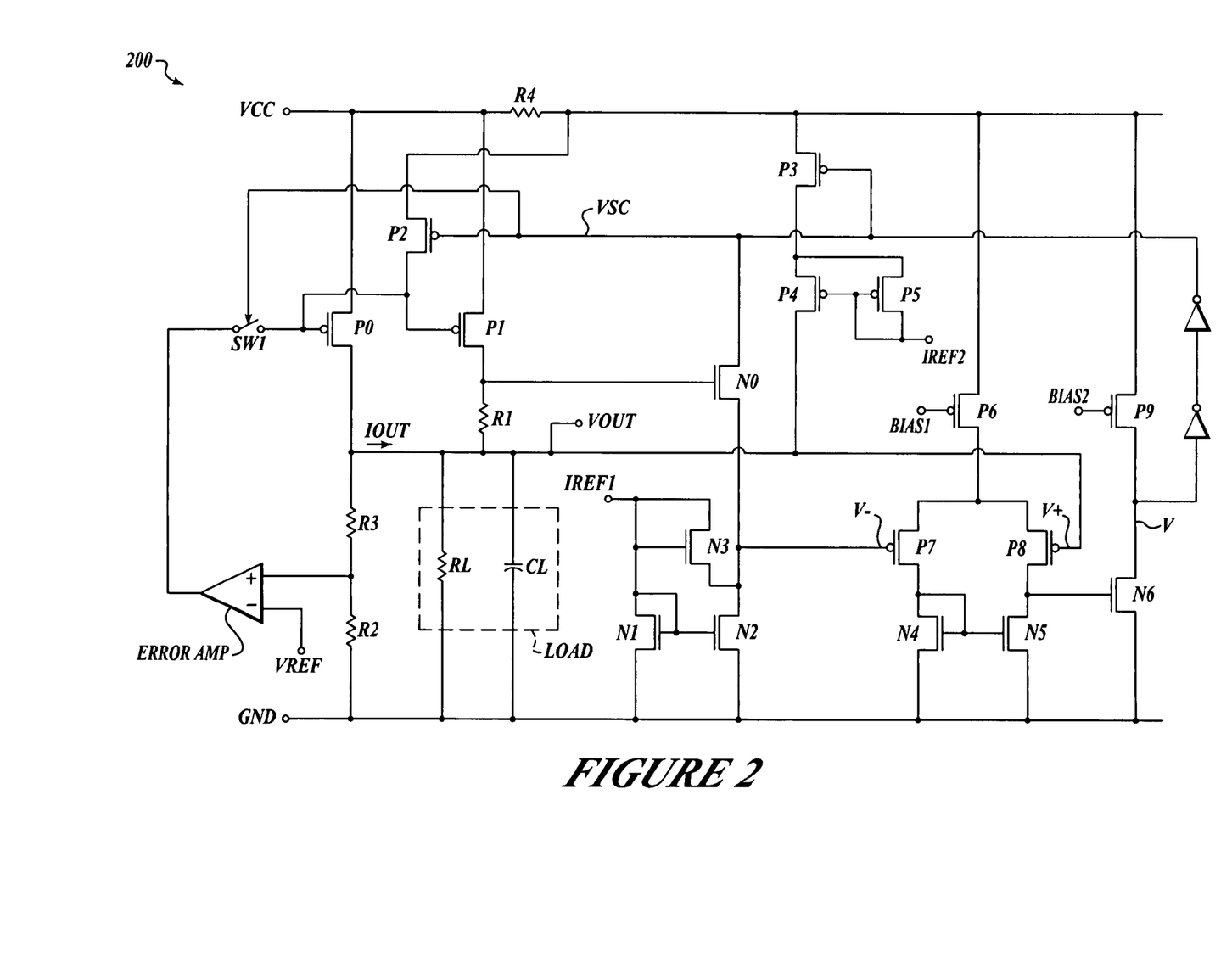
FIG. 2 is an illustration of a voltage regulator system that is arranged in accordance with an example of the present invention.

FIG. 2 is an illustration of a voltage regulator system (200) that is arranged in accordance with an example of the present invention. Regulator system 200 comprises: an error amplifier circuit (EA), a power device (P0), a feedback circuit (R2, R3), a switch circuit (SW1), and an over-current protection circuit. The over-current protection circuit comprises: a comparator circuit (CMP), nine transistors (P1–P5, and N0–N3), and two resistors (R1, R4). The load circuit is represented as a resistor (RL) that is coupled in parallel with a capacitor (CL).

Circuit 200 is operated from a VCC power supply and a circuit ground (GND). Reference currents (IREF1, IREF2) are applied to diode connected transistors N1 and P5 respectively. A reference voltage (VREF) is applied to the inverting input of the error amplifier circuit (EA). Resistors R2 and R3 are connected to the output load (RL, CL) to provide a feedback voltage (e.g., VFB) to the non-inverting input of the error amplifier. Transistor P0 delivers an output current (IOUT) to the load (RL, CL), which is replicated by transistor P1. Switch circuit SW1 is operated in a closed position when the VSC signal is de-asserted and an open position when the VSC signal is asserted. However, switch circuit SW1 may not be necessary when error amplifier circuit EA is designed to include an output stage with a passive type of pull-down circuit.

Power device P0 is the main power device that is principally responsible for delivering current to the load during a normal operation mode of regulator system 200. Transistor P1 and resistor R1 are arranged to operate as a current sense circuit that senses the output current that is delivered to the load, where a first sense voltage (VSNS1) is developed across resistor R1. Transistor N0 is arranged to operate as a level shifter that translates the first sense voltage (VSNS1) to a second sense voltage (VSNS2) that is coupled to an input of comparator circuit CMP (e.g., V−). Another input of comparator circuit CMP (e.g., V+) is coupled to the output (VOUT). Comparator circuit CMP is arranged to provide a short-circuit detection signal (VSC) when the short circuit condition is detected.

Transistor P2 is arranged to deactivate power device P0 and sense transistor P1 when the short-circuit condition is detected by the current sense circuit (transistor P1 and resistor R1). Transistors P4 and P5 are arranged in a current-mirror configuration to operate as a current source that provide a current to charge the output capacitor (CL) and load after the short-circuit condition is removed. Transistor P3 is arranged to enable the current source from transistors P4 and P5 when comparator circuit CMP asserts the VSC signal. One or more inverting circuits can be placed between the output of the comparator circuit (CMP) and the VSC signal to provide increased gain and/or changing the polarity of the control signal as may be required in other implementations. The current from transistor P4 is delivered to the load circuit (RL, CL) such that the output voltage (VOUT) increases after the short-circuit condition is removed. The level associated with the current from transistor P4 is related to the relative sizes of transistors P4 and P5, and to reference current level IREF2.

Transistors N1 and N2 are arranged in a current-mirror configuration to operate as a current source for transistor N0. Transistor N0 has a drain that is coupled to the output of the comparator (signal VSC), a gate that is coupled to the drain of transistor P1, and a source that is coupled to the drain of transistor N2. Transistor N3 is configured to maintain the inverting input (V−) of comparator circuit CMP at a level that is higher than the non-inverting input (V+) of the comparator during the short-circuit condition. The relative sizes (e.g., W/L ratio for a FET) of transistors N3 can be selected as smaller than that of transistors N1 and N2 to ensure proper operation. The short circuit current limit can be adjusted by selection of transistor sizes for transistors P1, N0 and N2, and the value associated with resistor R1. The sense current from transistor P1 flows to the output rather than the circuit ground, which provides for a reduction in power loss from wasted current.

For the example circuit illustrated in FIG. 2, transistor P3 is illustrated as a p-type field effect transistor (PFET) such that the VSC signal is asserted as an active low signal. However, other transistor configurations may be used such that the VSC signal is asserted as an active high signal.

An example comparator circuit (CMP) is illustrated as seven transistors (P6–P9, and N4–N6), configured as a two-stage comparator. Transistors P6 and P9 are biased to operate as current sources. In one example, transistors P6 and P9 are biased with a common biasing signal (e.g., BIAS). In another example, transistors P6 and P9 are biased with different biasing signals (e.g., BIAS1 and BIAS2). Transistors P7 and P8 are arranged to cooperate with transistor P6 to operate as a differential pair circuit with p-type transistors in the first stage. The positive input (V+) of the comparator circuit (CMP) is coupled to regulator output (OUT) such that V+=VOUT. The negative input of the comparator (V−) is coupled to the source of transistor N0, which is the level shifter transistor.

The mathematical relationship between various signals is described as follows:

$$V- = Vout + Is*R1 - Vgs(N0) \quad\quad\quad (Eq.\ 1)$$

$$Vgs(N0) = VTN + [(2L/W)_{N0} * Iref1 / (\mu nCox)]^{1/2}, \quad\quad (Eq.\ 2)$$

where Is corresponds to the sense current that flows through transistor P1 and resistor R1, VTN corresponds to a threshold voltage, $(L/W)_{N0}$ corresponds to an inverse of the size of transistor N0, μn corresponds to a mobility factor of electron, Cox corresponds to the oxide capacitance, and Vgs(N0) corresponds to the gate-source voltage of transistor N0.

In one example implementation, the sizes of transistor P0 and P1 are related to one another by a scaling factor (m) such that $(W/L)_{P0} = m*(W/L)_{P1}$. For this example, the short circuit current limit at which the comparator changes states corresponds to:

$$Isc = m*Is = m*Vgs(N0)/R1 \quad\quad\quad (Eq.\ 3)$$

During the normal operating mode of regulator system 200, VSC equals Vcc (e.g., active high) and transistor N2 is arranged to operate in its active region such that transistor N3 is deactivated (off state). In general, Vgd(N0)=Vout+Is*R1−Vcc. Transistor N0 is operated in its active region when Vgd(N0)<VTN. The current flowing through transistors N0 and N2 is constant (Iref1) such that Vgs(N0) is also a constant. The output voltage in normal operation is regulated such that it is also a constant (as an example of approximately 1V). As the sense current (Is) increases, the inverting input voltage (V−) will also increase. The output signal (Vsc) from the comparator circuit (CMP) will remain high until the first sense voltage (VSNS1) from current (Is) reaches a level given by Is*R1≈Vgs(N0). Once the first sense voltage exceeds the gate-source threshold requirements of transistor N0 (Is*R1>Vgs(N0)) the short-circuit detection signal is asserted (e.g., active low) by the comparator circuit (CMP) and transistors P0 and P1 are deactivated (completely switched off). Once transistors P0 and P1 are deactivated, the output voltage (Vout or V+) will begin to immediately decrease such that transistor N0 is deactivated (turned-off) and both V+ and V− drop "low" (e.g., to nearly the circuit ground potential). Transistors P3 and N3 will become active at the same time when the short-circuit detection signal is asserted such that transistor P4 will provide a constant current to the output. The output current from transistor P4 is relatively small and cannot cause a substantial increase in the output voltage (VOUT) while the short-circuit condition persists. Transistor N3 is arranged to increase the voltage of the inverting input (V−) at Vmin_OD during the short circuit condition such that it is always above the ground potential (e.g., a few milli volts, for example 2 mV above ground). Since the output voltage is below the inverting input voltage (V− is still higher than V+) the short-circuit detection signal (VSC) remains asserted (e.g., active low) while the short circuit condition exists. Thus, during the short-circuit condition, transistors N1 and N3 are operated in their active states, while transistor N2 operates in its linear region.

The size (W/L) of transistor N3 can be adjusted to change the amount of signal difference between the inverting input (V−) of the comparator circuit (CMP) and the ground potential. An example transistor size for a 2 mV difference is described roughly based on the following relationships during a short circuit condition:

$$Ids(N3)=Ids(N2)$$

$$Ids(N1)+Ids(N3)=Iref1$$

$$Vds(N2)=2\text{ mV}$$

$$Vgs(N3)=Vgs(N2)-2\text{ mV}$$

$$2\text{ mV}=Vgs(N2)-Vgs(N3) \quad (\text{Eq. 4})$$

In one example process, the relative size (W/L) of transistors N2 and N3 is determined such that transistor N3 has a relative size that is estimated to be ½0th of that for transistors N1 and N2. However, other size ratios between transistors N2 and N3 are also contemplated such as 5:1, 10:1, 15:1, as may be required by other operating parameters that are specific to a particular semiconductor process.

Once the short-circuit condition is removed, the current flowing from transistor P4 begins to charge capacitor CL and load resistor RL. The time required for V+ to be charged to over Vmin_OD (an example of 2 mV) is approximately given by:

$$t=CL*Vmin\_OD/(I_{DP4}-Vmin\_OD/RL), \quad (\text{Eq. 5})$$

where RL=Vout/Imax, and Imax is the maximum output (load) current for the regulator system. It is observed from Eq. 5 that $ID_{P4}>0.002*Imax/Vout=0.2$ mA when the regulated output voltage (VOUT) is 1V, Vmin_OD is 2 mV, and the maximum output current (Imax) is 100 mA. Based on these conditions, the relative sizes of transistors P4 and P5 can be determined. The size of P3 may be set as greater than or equal to that of transistor P4. After time period t, the output voltage (V+, VOUT) is higher than inverting input (V−) and the short-circuit detection signal (Vsc) is de-asserted (e.g., returns to a high signal).

The above-described circuit arrangement returns the regulator system to a normal operating mode automatically once the short-circuit condition terminates. The turn-off for power device under short-circuit condition is useful in reducing thermal related damage to the system. For example, transistor P0 may become damaged because of thermally induced metal fatigue, etc. The total quiescent current required for supplying the above described over-current protection circuit can be minimized with careful design considerations. In one example, the total quiescent current is about 0.8 μA during normal operation.

Figure 3:
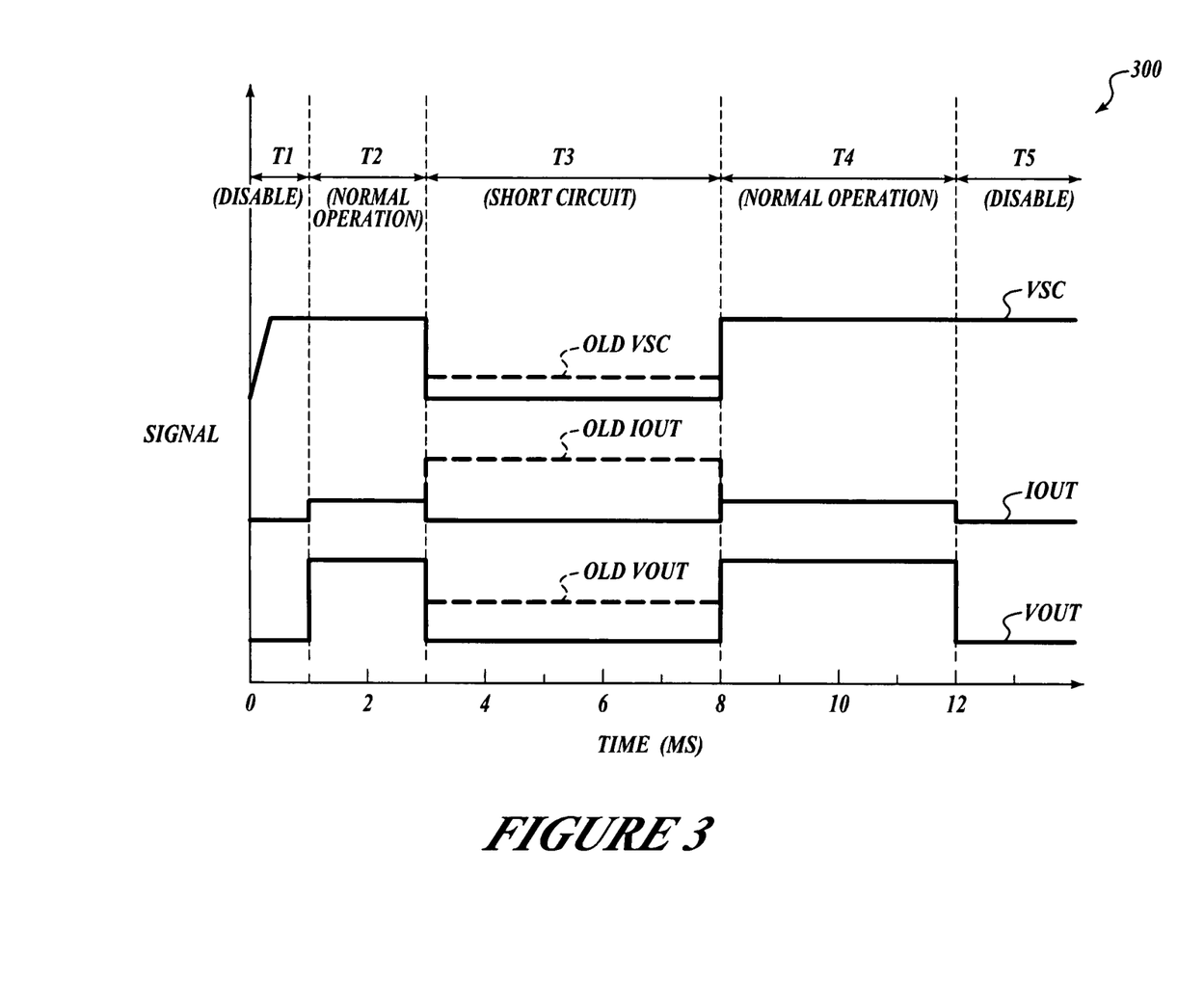
FIG. 3 is an illustration of example signal waveforms for the circuit illustrated in FIG. 2.

FIG. 3 is an illustration of example signal waveforms (300) for circuit 200 illustrated in FIG. 2. Various time periods (T1–T5) are labeled on FIG. 3 to illustrate the various operating modes that are contemplated in circuit 200.

During time-period T1 (disable), the regulator is inactive (disabled) such as during a power-on reset condition. The short circuit detection signal (VSC) increases to the nominal operating level (Vcc, active high) during this time-period, while the output current (IOUT) is approximately zero since transistor P0 is disabled, resulting in an output voltage (VOUT) that is collapsed to the circuit ground potential.

During time period T2 (normal operation), the regulator is active in a normal operating mode where no short-circuit condition is present in the system. Output current (IOUT) is delivered to the load circuit (RL, CL) developing an output voltage (VOUT) as shown in the FIGURE.

During time period T3 (short circuit), a short circuit condition is applied across the load circuit (RL, CL). In the present invention as illustrated in FIG. 2, the output current (IOUT) drops to approximately zero (neglecting the current from transistor P4 since it is very small by design), while the output current in the prior art implementation (See FIG. 1) increases to a clamped level as illustrated by OLD IOUT. Similarly, the output voltage in the present invention decreases to approximately the circuit ground potential while the prior art circuit may have a non-zero voltage as illustrated by OLD_VOUT. The short-circuit detection signal in the present invention is coupled to a potential of approximately ground, while the prior art implementation from FIG. 1 results in a potential that is a non-ground potential.

Time period T4 (normal operation) illustrates that circuit 200 returns to a normal operating mode after the short circuit condition is removed. As described previously, transistor P4 provides a current to the output when the short-circuit condition is removed such that the output voltage (VOUT) increases sufficient to re-enable power device P0 via the operation of comparator circuit CMP and transistor P2.

Time period T5 (disable) illustrates that circuit 200 may be disabled at a later time where regulation is no longer desired (e.g., a sleep mode or power conservation mode).

In one example implementation, VOUT decreases to potential of 0V during the short-circuit condition and IOUT decreases down to a current of approximately 200 uA. In contrast, a prior art implementation such as that illustrated in FIG. 1 has a clamped output current on the order of 330 mA.

As observed by the above described differences in short-circuit operation, the thermal generation is high in the conventional circuit while very low in the present invention. By switching off the power device during the short-circuit mode, energy loss during short-circuit operation is greatly reduced. Once the short-circuit condition is removed, the protection circuit of the present invention allows the regulator to automatically return to normal operation. The currents from the sense circuit are provided directly to the output rather than the circuit ground so that the quiescent current of the regulator does not rise with increased load current. The circuit arrangement of the present invention provides for a decreased short circuit current limit as temperature increases, providing yet further protection to the various circuits. The novel protection circuit of the present invention results in significant reductions in energy loss and reduces risks of any thermal induced device failure during short circuit operation.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for controlling an output current ($I_{OUT}$) that is delivered to a load circuit by a power device, the apparatus comprising:
    a current sense circuit that is arranged to provide a sense signal that is responsive to the output current, wherein the current sense circuit is coupled to the load circuit such that the operating current of the apparatus does not dramatically rise when a short-circuit condition is present across the load circuit, wherein the current sense circuit comprises a first transistor that is series coupled to the load circuit via a resistor such that the sense signal corresponds to a voltage associated with the resistor, wherein the first transistor includes a control terminal that is biased in common with the power device;
a first transistor circuit that is arranged to deactivate the power device when a short-circuit detection signal is asserted;
a second transistor circuit that is arranged to couple a small current to the load circuit when the short-circuit detection signal is asserted such that the apparatus automatically returns to a normal operating mode when the short-circuit condition is removed from the load circuit, wherein the small current corresponds to a nominal level such that the energy loss is minimized during the short-circuit condition; and
a differential comparator circuit that includes: a first input that is coupled to the load circuit, a second input that is coupled to the sense signal, and an output that is associated with the short circuit detection signal, wherein the comparator circuit is arranged to assert the short-circuit detection signal as a logic level when the sense signal indicates that the short-circuit condition is detected across the load circuit.

2. The apparatus of claim 1, wherein the first transistor circuit comprises a p-type transistor that includes a source terminal that is coupled to a power supply node, a gate terminal that is arranged to receive the short-circuit detection signal, and a drain terminal that is coupled to a control terminal of the power device such that the power device is deactivated when the short-circuit detection signal is asserted as an active low signal.

3. The apparatus of claim 1, wherein the second transistor circuit comprises a first p-type transistor that includes a source terminal that is coupled to a power supply node, a gate terminal that is arranged to receive the short-circuit detection signal, and a drain terminal that is coupled to a local power supply node; and a second p-type transistor that includes a source terminal that is coupled to the local power supply node, a gate terminal that is arranged to receive a bias signal, and a drain terminal that is coupled to the load circuit, wherein the first p-type transistor is arranged to couple the power supply node to the local supply node when the short-circuit detection signal is asserted as an active low signal such that the second p-type transistor is operates as a current source to provide the small current when the short-circuit detection signal is asserted.

4. The apparatus of claim 3, the second transistor circuit further comprising a third p-type transistor that is arranged to provide the bias signal in response to a reference current.

5. The apparatus of claim 1, wherein the comparator circuit includes at least one inverting gain stage.

6. An apparatus for controlling an output current ($I_{OUT}$) that is delivered to a load circuit by a power device, the apparatus comprising:
a current sense circuit that is arranged to provide a sense signal that is responsive to the output current, wherein the current sense circuit is coupled to the load circuit such that the operating current of the apparatus does not dramatically rise when a short-circuit condition is present across the load circuit, wherein the current sense circuit comprises a first p-type transistor that includes a source terminal that is coupled to a power supply node, a gate that is coupled to a control node, and a drain that is coupled to the load circuit through a resistor such that the sense signal corresponds to a voltage that is associated with the resistor; and wherein the first transistor circuit comprises a second p-type transistor that includes a source terminal that is coupled to the power supply node, a gate terminal that is arranged to receive the short-circuit detection signal, and a drain terminal that is coupled to a control terminal of the power device at the control node such that the power device and the first-p-type transistor are deactivated when the short-circuit detection signal is asserted as an active low signal;
a first transistor circuit that is arranged to deactivate the power device when a short-circuit detection signal is asserted;
a second transistor circuit that is arranged to couple a small current to the load circuit when the short-circuit detection signal is asserted such that the apparatus automatically returns to a normal operating node when the short-circuit condition is removed from the load circuit, wherein the small current corresponds to a nominal level such that the energy loss is minimized during the short-circuit condition; and
a differential comparator circuit that includes: a first input that is coupled to the load circuit, a second input that is coupled to the sense signal, and an output that is associated with the short circuit detection signal, wherein the comparator circuit is arranged to assert the short-circuit detection signal as a logic level when the sense signal indicates that the short-circuit condition is detected across the load circuit.

7. The apparatus of claim 6, further comprising: a level shifter circuit that is responsive to the sense signal, wherein the level shifter circuit is arranged to provide another sense signal that is related to the sense signal by a level shift, wherein the sense signal is coupled to the second input of the comparator circuit as the another sense signal.

8. The apparatus of claim 7, wherein the level shifter circuit is arranged to provide a predetermined voltage level to the second input of the comparator circuit after the short circuit detection signal is asserted, wherein the predetermined voltage level is different from a power supply potential to provide a minimum over-drive to the comparator circuit while the load circuit is short-circuited.

9. The apparatus of claim 6, wherein the second transistor circuit comprises a first p-type transistor that includes a source terminal that is coupled to a power supply node, a gate terminal that is arranged to receive the short-circuit detection signal, and a drain terminal that is coupled to a local power supply node; and a second p-type transistor that includes a source terminal that is coupled to the local power supply node, a gate terminal that is arranged to receive a bias signal, and a drain terminal that is coupled to the load circuit, wherein the first p-type transistor is arranged to couple the power supply node to the local supply node when the short-circuit detection signal is asserted as an active low signal such that the second p-type transistor is operates as a current source to provide the small current when the short-circuit detection signal is asserted.

10. An apparatus for controlling an output current ($I_{OUT}$) that is delivered to a load circuit by a power device, the apparatus comprising:
a current sense circuit that is arranged to provide a sense signal that is responsive to the output current, wherein the current sense circuit is coupled to the load circuit such that the operating current of the apparatus does not dramatically rise when a short-circuit condition is present across the load circuit;

a first transistor circuit that is arranged to deactivate the power device when a short-circuit detection signal is asserted;

a second transistor circuit that is arranged to couple a small current to the load circuit when the short-circuit detection signal is asserted such that the apparatus automatically returns to a normal operating mode when the short-circuit condition is removed from the load circuit, wherein the small current corresponds to a nominal level such that the energy loss is minimized during the short-circuit condition;

a differential comparator circuit that includes: a first input that is coupled to the load circuit a second input that is coupled to the sense signal, and an output that is associated with the short circuit detection signal, wherein the comparator circuit is arranged to assert the short-circuit detection signal as a logic level when the sense signal indicates that the short-circuit condition is detected across the load circuit; and a level shifter circuit that is responsive to the sense signal, wherein the level shifter circuit is arranged to provide another sense signal that is related to the sense signal by a level shift, wherein the sense signal is coupled to the second input of the comparator circuit as the another sense signal.

11. The apparatus of claim 10, wherein the level shifter circuit is arranged to provide a predetermined voltage level to the second input of the comparator circuit after the short circuit detection signal is asserted, wherein the predetermined voltage level is different from a power supply potential to provide a minimum over-drive to the comparator circuit while the load circuit is short-circuited.

12. The apparatus of claim 10, wherein the level shifter circuit comprises: a first n-type transistor that includes a drain that is couple to the short-circuit detection signal, a gate that is arranged to receive the sense signal, and a source that is coupled to the second input of the comparator circuit at a first node; a second n-type transistor that includes a drain that is coupled to the first node, a gate that is arranged to receive a bias signal from a second node, and a source that is coupled to a power supply node; and a third transistor that is includes a gate and drain that are coupled to the second node, and a source that is coupled to the first node.

13. The apparatus of claim 12, wherein the third n-type transistor is ratio sized with respect to the second n-type transistor such that the third transistor is arranged to provide the minimum over-drive to the comparator circuit while the load circuit is short-circuited.

14. The apparatus of claim 12, the level shifter circuit further comprising a fourth n-type transistor that includes a gate and drain that are coupled to the second node, and a source that is coupled to the power supply node, wherein the fourth n-type transistor is ratio sized to the second n-type transistor to provide the biasing signal in response to a reference current that is applied to the second node.

15. The apparatus of claim 10, wherein the current sense circuit comprises a first transistor that is series coupled to the load circuit via a resistor such that the sense signal corresponds to a voltage that is associated with the resistor, wherein the first transistor includes a control terminal that is biased in common with the power device.

16. An apparatus for controlling an output current ($I_{OUT}$) that is delivered to a load circuit by a power device, the apparatus comprising:

a current sense means, wherein the current sense means is arranged to provide a sense signal that is responsive to the output current, wherein the current sense means is coupled to the load circuit such that there is approximately no DC current in the apparatus when a short-circuit condition is present across the load circuit, wherein the current sense means comprises a transistor means that is series coupled to the load circuit via a resistor means such that the sense signal corresponds to a voltage associated with the resistor means, wherein the transistor means is arranged for common biasing with the power device;

a disabling means that is arranged to disabled the power device when a short-circuit detection signal is asserted;

a recovery current means that is arranged to provide a small current (I) to the load circuit when the short-circuit detection signal is asserted such that the apparatus automatically returns to a normal operating mode when the short-circuit condition is removed from the load circuit;

a differential comparator means that is arranged to assert the short-circuit detection signal as a logic level when the sense signal indicates that the short-circuit condition is detected across the load circuit; and a minimum over-drive means that is arranged to maintain at least one input signal to the comparator means at a minimum over-drive level (Vmin_OD) when the short circuit condition is present.

17. The apparatus of claim 16, wherein the the transistor means sized relative to the power device according to a size ratio (m) such that the short circuit current limit is determined by the size ratio (m).

18. The apparatus of claim 17, wherein the resistor means has a value corresponding to R, wherein the short circuit current limit (Isc) is determined as: Isc=m*Vgs/R, wherein Vgs corresponds to a gate-source voltage of a transistor, which is related to a threshold voltage and associated with the transistor means, and wherein the threshold voltage is dependent on temperature.

19. The apparatus of claim 16, wherein the recovery current means includes a current source means that is selectively activated when the short-circuit detection signal is asserted to provide the small current (I) over a recovery time (t), wherein the recovery time (t) is determined as: t=CL*Vmin_OD/(I−Vmin_OD/1L), where Vmin_OD is a minimum overdrive voltage, CL is a capacitor associated with the load circuit, RL is a resistance associated with the load circuit.

20. A method for providing a current ($I_{OUT}$) to a load circuit from a power device, the method comprising:

biasing a transistor circuit in common with the power device;

coupling a current from the transistor circuit to the load circuit through a resistor circuit;

sensing the current though the resistor circuit to to provide a sense signal that is responsive to the output current from the power device;

sensing an output voltage that is associated with the load circuit;

differentially comparing the sense signal to the sensed output voltage;

asserting a logic level short-circuit detection signal when the sensed output voltage is less than the sense signal;

disabling the power device when the short-circuit detection signal is asserted;

enabling a current source when the short-circuit detection signal is asserted, wherein the current source is coupled to the load circuit;

increasing the output voltage across the load with the current source when the short-circuit condition is removed from the load circuit;

detecting when the short circuit condition is removed from the load circuit; and enabling the power device when the short-circuit condition is detected as removed from the load circuit.

21. The method of claim 20, further comprising: changing the sense signal in response to an operating temperature associated with the power device such that a threshold associated with the detection of the short-circuit condition is adjustable.

22. The method of claim 20, further comprising: maintaining a minimum overdrive condition such that the output voltage must increase above a predetermined amount after the short circuit condition is detected as removed from the load circuit.

23. The method of claim 20, further comprising: disabling the current source when the short-circuit condition is detected as removed from the load circuit.

24. An apparatus for controlling an output current ($I_{OUT}$) that is delivered to a load circuit by a power device, the apparatus comprising:

a current sense means, wherein the current sense means is arranged to provide a sense signal that is responsive to the output current, wherein the current sense means is coupled to the load circuit such that there is approximately no DC current in the apparatus when a short-circuit condition is present across the load circuit;

a disabling means that is arranged to disabled the power device when a short-circuit detection signal is asserted;

a recovery current means that is arranged to provide a small current (I) to the load circuit when the short-circuit detection signal is asserted such that the apparatus automatically returns to a normal operating mode when the short-circuit condition is removed from the load circuit;

a level shifting means that is responsive to the sense signal, wherein the level shifting means is arranged to provide a level shifted sense signal that is related to the sense signal by a level shift;

a differential comparator means that is arranged to assert the short-circuit detection signal as a logic level when the level shifted sense signal indicates that the short-circuit condition is detected across the load circuit; and a minimum over-drive means that is arranged to maintain at least one input signal to the comparator means at a minimum over-drive level (Vmin_OD) when the short circuit condition is present.

25. A method for providing a current ($I_{OUT}$) to a load circuit from a power device, the method comprising:

sensing the current though a resistor circuit to provide a sense signal that is responsive to the output current from the power device;

sensing an output voltage that is associated with the load circuit;

level shifting the sense signal to provide a level shifted sense signal that is related to the sense signal by a level shift;

differentially comparing the level shifted sense signal to the sensed output voltage;

asserting a logic level short-circuit detection signal when the sensed output voltage is less than the level shifted sense signal;

disabling the power device when the short-circuit detection signal is asserted;

enabling a current source when the short-circuit detection signal is asserted, wherein the current source is coupled to the load circuit;

increasing the output voltage across the load with the current source when the short-circuit condition is removed from the load circuit;

detecting when the short circuit condition is removed from the load circuit; and enabling the power device when the short-circuit condition is detected as removed from the load circuit.

* * * * *

UNITED STATES PATENT AND TRADEMARK OFFICE
CERTIFICATE OF CORRECTION

PATENT NO. : 7,042,280 B1 Page 1 of 1
APPLICATION NO. : 10/737254
DATED : May 9, 2006
INVENTOR(S) : Shengming Huang et al.

It is certified that error appears in the above-identified patent and that said Letters Patent is hereby corrected as shown below:

Column 7, Line 48: "transistor is operates" should read --transistor is operated--

Column 8, Line 58: "transistor is operates" should read --transistor is operated--

Column 9, Line 37: "drain that is couple" should read --drain that is coupled--

Column 9, Line 45: "is includes a gate" should read --includes a gate--

Column 10, Line 46: "(I-Vmin_OD/1L)" should read --(I-Vmin_OD/RL)--

Signed and Sealed this

Twenty-sixth Day of September, 2006

JON W. DUDAS
*Director of the United States Patent and Trademark Office*